United States Patent [19]

Barshter

[11] 4,446,357

[45] May 1, 1984

[54] RESISTANCE-HEATED BOAT FOR METAL VAPORIZATION

[75] Inventor: Dennis W. Barshter, Grand Island, N.Y.

[73] Assignee: Kennecott Corporation, Cleveland, Ohio

[21] Appl. No.: 316,464

[22] Filed: Oct. 30, 1981

[51] Int. Cl.³ .............................................. C23C 13/12
[52] U.S. Cl. .................................. 219/275; 219/271; 118/726; 432/264
[58] Field of Search ............... 219/271, 275, 420, 426, 219/427, 421, ; 427/50, 49, 51; 118/726, 727, 50.1, 620; 432/264, 265

[56] References Cited

U.S. PATENT DOCUMENTS

| | | | |
|---|---|---|---|
| 2,996,412 | 8/1961 | Alexander | 117/221 |
| 3,020,177 | 2/1962 | Alexander | 117/107 |
| 3,063,865 | 11/1963 | Baer | 117/66 |
| 3,281,517 | 10/1966 | Hemmer | 219/275 |
| 3,514,575 | 5/1970 | Hall | 118/726 |
| 3,515,852 | 6/1970 | Matheson | 219/275 |
| 3,636,300 | 1/1972 | Passmore | 219/271 |
| 3,636,305 | 1/1972 | Passmore | 219/271 |
| 4,264,803 | 4/1981 | Shinko | 219/275 |

Primary Examiner—B. A. Reynolds
Assistant Examiner—Teresa J. Walberg
Attorney, Agent, or Firm—Harold M. Snyder; Raymond W. Green; R. Lawrence Sahr

[57] ABSTRACT

The resistance-heated boat of the present invention is comprised of a heating portion and a crucible portion separated by a heat conducting, substantially non-electrical conducting portion.

The heating portion is fabricated of an electrically conductive material capable of being resistance heated to high temperatures. Mixtures of titanium diboride with boron nitride, aluminum nitride or silicon carbide typically provide electrical conductivity in the desired range. Zirconium diboride, mixtures of boron nitride, silicon nitride, aluminum nitride or titanium diboride, or mixtures thereof are also useful.

The crucible portion of the boat provides a vaporization surface and is fabricated of materials selected for their ability to provide wettability by the metal to be vaporized, a desired chemical and physical resistance to the metal, or impurities in the metal, to be vaporized and to the vaporization atmosphere. Titanium diboride, zirconium diboride and mixtures thereof are eminently useful in providing a vaporization surface.

The separating portion is formed of a heat-conducting, substantially non-electrical-conducting material. The separating portion may also be comprised entirely, or mixtures of, materials containing a major portion, of boron nitride, boron oxide, or mixtures thereof. A preferred material is boron nitride.

9 Claims, 4 Drawing Figures

RESISTANCE-HEATED BOAT FOR METAL VAPORIZATION

BACKGROUND OF THE INVENTION

The present invention relates to resistance-heated containers or crucibles, commonly called boats, heaters, or intermetallic sources, for use in the vacuum vaporization of metals.

It is well known in the prior art that various substrates, for example, glass, metal and plastics, may be coated with a thin layer of metal by vacuum deposition processes. Generally, in such processes, a vaporizable metal, such as aluminum, chromium, copper, zinc, silver or gold, is vaporized at a high temperature under vacuum and the metallic vapor deposited on the desired substrate. The metal is vaporized by heating in a boat, which serves both as a heater and a crucible. Typically, a boat consists of an elongated bar of electrically conductive material. Boats may have flat vaporization surfaces or, more usually, a depression in the vaporization surface to hold a supply, or pool, of metal to be vaporized. The boat is connected to a source of electricity. The electrical resistance of the boat causes the boat to heat upon passage of electrical current therethrough. The heat vaporizes the metal supplied to the vaporization surface.

The resistance-heated vaporization boats commonly in use today consist of a mixture of ceramic or intermetallic composite materials, for example, titanium diboride with boron nitride, or silicon carbide, or titanium diboride with boron nitride and aluminum nitride. Such mixtures have service lives substantially longer than the metal or graphite materials previously used. However, these materials have serious drawbacks in use. The mixtures are selected on the basis of their chemical and physical resistance to the metal being vaporized and their appropriate electrical resistance. Typically, boride components are utilized to impart high electrical conductivity, physical and chemical resistance to attack by molten and vaporized metals and to provide wettability to the vaporization surface. Typically, nitride components, which are good electrical insulators but are, generally, not wet by molten metals, such as aluminum, are utilized to adjust the electrical resistivity to a level for heating element use. Thus, the materials in use today are compromises which do not provide the best characteristics for either purpose.

Metals vaporized in conventional boats act as a parallel conductor in the electrical circuit containing the boat. The electrical resistance of the circuit is dependent upon the metal depth, composition and temperature. At high temperatures, such as those used in metal vaporization processes, the metals and impurities in the metals react with the materials of the boat varying the electrical resistance of the boat. This variance requires continual adjustment of the power supply to maintain a desired power input, hence, the boat temperature, and, in turn, the vaporization rate.

The present vacuum metallizing boats overcome the shortcomings of the prior art by providing a multi-layered boat. The present boat allows the vaporization surface of the boat to be fabricated of materials selected solely on the basis of their wettability, their chemical and physical resistance to molten metals and metal vapors and independently allows a heating element portion to be selected from materials solely on the basis of their electrical resistance properties.

GENERAL DESCRIPTION OF THE INVENTION

The resistance-heated boat of the present invention is comprised of a heating portion and a crucible portion separated by a heat conducting, substantially non-electrical conducting portion.

The heating portion, or heating element, is fabricated of an electrically conductive material of a specific, selected electrical resistance, capable of being resistance heated to high temperatures. The heating portion preferably has sufficient mechanical strength to be self supporting. Suitably, the heating portion is fabricated of refractory metal carbides, borides, nitrides, silicides, oxides and mixtures thereof. Such materials or mixtures are selected solely on their ability to provide the desired electrical resistance. Mixtures of titanium diboride with boron nitride, aluminum nitride or silicon carbide typically provide electrical conductivity in the desired range. Zirconium diboride, mixtures of boron nitride, silicon nitride, aluminum nitride or titanium diboride, or mixtures thereof are also useful. The length of a heating element in a resistance-heated boat is generally determined by the vaporization equipment in which the boat is to be used. The cross-section of the heating portion of the present boat may, therefore, more practically be varied to obtain the desired electrical resistance and optimum heat distribution without affecting the vaporization surface. For example, decreasing the width or thickness of a section of the heating portion of the boat would increase the heat generated by the boat, or in the area of decreased cross-section, without requiring alteration of the vaporizing surface shape.

The crucible portion of the present boat provides a vaporization surface and is fabricated of materials, for example, refractory metal carbides, borides, nitrides, silicides, oxides and mixtures thereof, selected solely on their ability to provide wettability by the metal to be vaporized, a desired chemical and physical resistance to the metal, or impurities in the metal, to be vaporized and to the vaporization atmosphere. For example, titanium diboride, zirconium diboride and mixtures thereof are eminently useful in providing vaporization surface wettable by the metal to be vaporized and have excellent resistance to attack by molten and vaporized metals, such as aluminum, copper, nickel and chromium, and by the impurities generally included or associated therewith. Previously, such materials could not be utilized in whole or in large amounts because of their undesirable electrical conductivity and the requirement that the boat possess a low electrical conductivity for resistance heating.

The separating portion is formed of a heat-conducting, substantially non-electrical-conducting material. The separating portion may suitably be fabricated of boron nitride, boron oxide, or mixtures thereof. A preferred material is boron nitride. The separating portion may also be comprised of mixtures of materials containing a major portion of boron nitride, boron oxide, or mixtures thereof. Preferably, such mixtures contain a minimum of 90 percent by weight and, more preferably, a minimum of 95 percent by weight of boron nitride, boron oxide or mixtures thereof. Examples of suitable materials which may be included in the separating portion are boron carbonate and calcium borate. Since the main objective of the separating portion is to conduct heat from the heating portion to the crucible portion while electrically insulating the heating portion from the crucible portion, the separating portion may be in the form of a thin layer or, in some embodiments, in the form of a film, which may be applied in the form of chemical vapor deposition, by painting or by spraying. The separating portion is substantially non-electrically conductive, that is, it has a volume resistivity greater than about $10^3$ ohm-cm and, more preferably, greater than about $10^6$ ohm-cm, measured at ambient temperature.

DETAILED DESCRIPTION OF THE INVENTION

The invention will be illustrated and more fully described by reference to the accompanying drawings.

Figure 1:
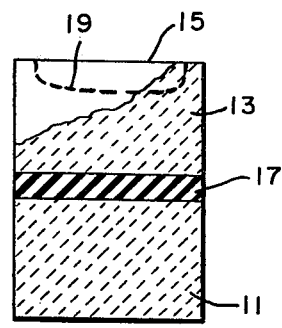
FIG. 1 is a diagrammatic view of a preferred embodiment of the invention.

Now looking at FIG. 1, heating portion 11 is fabricated of an electrically conducting refractory material, for example, metal carbides, borides, nitrides, silicides, oxides, or mixtures thereof. Particularly useful are mixtures of titanium diboride with boron nitride, aluminum nitride or silicon carbide. The length, composition and cross-sectional shape and size of 11 may be varied to match the resistance circuit and obtain the desired heat generation. Generally, the length of the heating portion 11 is predetermined by the vaporization unit in which it is used, and, as a practical matter, the cross-sectional area or composition of the heating portion is varied to vary the electrical conductivity. However, the present invention allows the composition of the heating portion 11 to be selected on the basis of electrical conductivity alone, independent of the resistance to attack by the molten metal to be vaporized. Thus, the heating portion may be designed to predetermined length and cross-section to match the resistance circuit and provide the desired heat.

The crucible portion 13 is fabricated of a refractory material, for example, metal carbides, borides, nitrides, silicides, oxides, or mixtures thereof. The crucible portion 13 provides a vaporization surface 15 which is wet by the metal to be vaporized and which is chemically and physically resistant to molten metals and metal vapors. Surface 15 may suitably have a groove or cavity, such as 19, in the top portion to receive and hold the molten metal prior to vaporization.

Heating portion 11 and crucible portion 13 are separated by separating portion 17 which is fabricated of a material which is a good heat conductor but is a very poor electrical conductor. Suitably, boron nitride, boron oxide, or mixtures thereof may be used. Preferably, boron nitride is utilized. Mixtures of ceramic materials containing a major amount, preferably a minimum of 90 percent by weight, and, more preferably, a minimum of 95 percent by weight, of boron nitride, boron oxide, or mixtures thereof, may be used. Suitable ceramic materials are selected on the basis of their effect on electrical resistivity of the separating layer. Usually, large amounts of such diluents, or modifiers, have an adverse affect by reducing the electrical resistivity of the separating portion to an undesirable level. Examples of ceramic materials which may be included in the separating portion 17 are boron carbonate, calcium borate or mixtures thereof. While separating portion 17 may be widely varied in thickness, a heat conducting, electrical insulating barrier is the essential requirement and, in a preferred embodiment, is in the form of a thin layer. Thicknesses between about 0.05 and about 0.50 centimeters are suited, and, more preferably, between about 0.10 and about 0.15 centimeters are practical and useful. Separating portion 17 has good heat conductivity, that is, it has a thermal conductivity between about 0.008 cal-cm$^2$/sec/(°C./cm) Cnd about 0.500 cal-cm$^2$/sec/(°C./cm) and, more preferably, between about 0.05 and about 0.15 cal-cm$^2$/sec/ (°C./cm) The electrical resistivity of separating portion 17 is greater than about $10^3$ ohm-cm and, preferably, greater than about $10^6$ ohm-cm.

In comparison, the ratio of the electrical resistivity of heating portion 11 to the electrical resistivity of the separating portion 17 is in the range of about 1 to 100, and, more preferably, in the range of 1 to 10,000, and, most preferably, in the range of 1 to 1,000,000 or higher.

In use, the ends of heating portion 11 are clamped in or to binding posts or other convenient means for supplying electric power to heating portion 11, positioned within a vacuum chamber. Provision is made within the chamber for locating the article to be coated in line of sight with vaporizing surface 15 so that the metallic vapor emanating therefrom will condense and be deposited on the article. Typically, the vacuum within the chamber is reduced to less than 0.001 mm Hg. Sufficient electric power is then supplied to heating portion 11 to heat vaporizing surface 15 to a temperature sufficiently high to vaporize a metal charge either located on, or supplied to, vaporizing surface 15 causing the metal to evaporate at a useful rate and the metal vapor to be deposited on the article.

Figure 2:
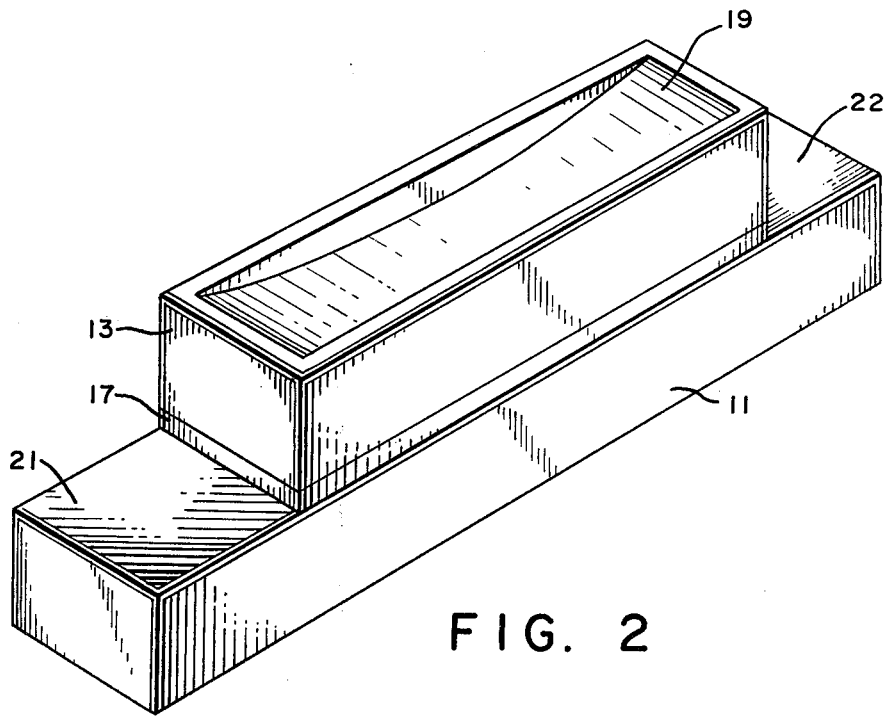
FIG. 2 is a perspective view of the embodiment shown in FIG. 1.

FIG. 2 shows the elongated boat of FIG. 1. In this view, heating portion 11 has extended ends, such as 21 and 22, adapted to be clamped or otherwise connected to a source of electrical energy.

Figure 3:
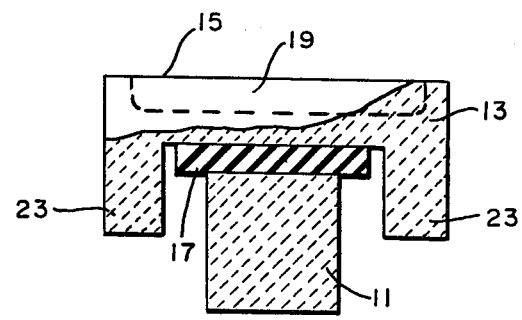
FIG. 3 is a diagrammatic view of another preferred form of the invention.

FIG. 3 illustrates a preferred embodiment wherein the crucible portion 13 is extended downward around heating portion 11. The extensions 23 of crucible portion 13 extend along the sides of heating portion 11. The extended sides 23 of crucible portion protect the heater from metallic vapors and/or contaminents associated therewith, thus substantially reducing the heater surface which is exposed to such vapors. This embodiment reduces the chemical degradation of the heater and the consequent electrical resistance changes which are caused by such degradation. The extended sides of crucible portion 13 may be separated from heater portion 11 by a separating layer, such as 17, along both top and sides, or, as shown in FIG. 3, may be separated by layer 17 atop heating portion 11 and by being physically separated along the sides of heating portion 11 and the inside surface of the extended sides of crucible portion 13. In either embodiment, the metallic vapors produced are in a purer form in that the heating portion 11, being contiguous to the extended sides of the crucible portion, is protected from attack, and decomposition products from the heating portion are not diffused into the vaporization atmosphere. Such embodiments are particularly useful in the vaporization of aluminum/ silicon/copper alloys in the semi-conductor field, because of the desired high purity of the film to be deposited, typically on silicon wafers. In the embodiment shown, wherein the extended sides 23 of crucible portion 13 are physically separated, the heat radiating from the sides of heating portion 11 is utilized to add additional heat to crucible portion 13 and thus more efficiently utilize the heat supplied by heating portion 11.

In addition, such embodiments extend the operating life of heating portion 11 by reducing the exposed surface area of the heating portion, which results in a lessening of diffusion of components having relatively high vapor pressures which are typically used in heating portions, for example, aluminum nitride and boron nitride. Further, the composition of separating layer 17 may include the diffusive component or components of heating portion 11, thereby providing a diffusive source of such component or components which will diffuse into the heating layer, offsetting the loss of such component or components from the exposed surface of heating portion 11.

The present vaporization boat may be made having various cross-sectional configurations, for example, the boat may be polygonal, round, elliptical or semi-flat in cross-section.

Figure 4:
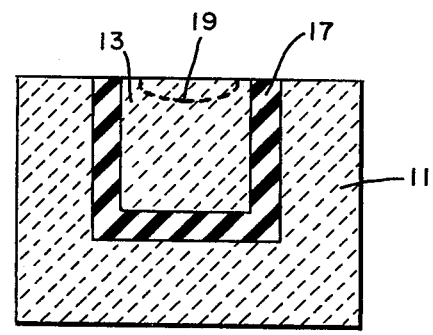
FIG. 4 is a diagrammatic view of a further preferred form of the invention.

FIG. 4 illustrates an alternate preferred embodiment wherein heating portion 11 surrounds crucible portion 13 on at least three sides (shown), and, if desired, two ends (not shown) and is separated along all surfaces by separating portion 17. This embodiment yields maximum heat transfer from heating portion 11 to crucible portion 13. However, exposure of heating portion 11 to attack by metallic vapors is also maximized, and, consequently, this embodiment may only be efficiently utilized in selected processes.

In use, heating elements, such as 11, tend to change, either increasing or decreasing the electrical conductivity due to high temperature and chemical attack. The present invention, particularly the embodiment shown in FIG. 3, allows heating portions to be designed which are more durable and will change or decrease in electrical conductivity, that is, fail, in a predictable manner.

The foregoing description and embodiments are intended to illustrate the invention without limiting it thereby. It will be understood that various modifications can be made in the invention without departing from the spirit or scope thereof.

What is claimed is:

1. A resistance-heated boat comprised of:
   (a) an elongated heating portion comprised of a material selected from the group of refractory metal carbides, borides, nitrides, silicides, oxides and mixtures thereof.
   (b) an elongated crucible portion comprised of a material selected from the group of refractory metal carbides, borides, nitrides, silicides, oxides, and mixtures thereof, said heating portion being substantially coextensive with said crucible portion.
   (c) a heat conducting, substantially non-electrical conducting portion having a thermal conductivity between about 0.008 and about 0.500 cal-cm$^2$/sec/(°C./cm) and an electrical resistivity greater than 10$^3$ ohm-cm, said heat conducting portion being substantially coextensive with said crucible portion and being disposed between and in coextensive contact with said crucible portion and heater portion to form a high heat conductivity bridge therebetween.

2. The boat of claim 1 wherein the heating portion is selected from the group of zirconium diboride, boron nitride, silicon nitride, aluminum nitride, titanium diboride, and mixtures thereof.

3. The boat of claim 2 wherein the crucible portion is selected from titanium diboride, zirconium diboride and mixtures thereof.

4. The boat of claim 3 wherein the heat conducting, substantially non-electrical conducting portion is comprised of at least 90 percent by weight of a material selected from the group of boron nitride, boron oxide, and mixtures thereof.

5. The boat of claim 4 wherein the heat conducting, substantially non-electrical conducting portion is comprised of at least 90 percent by weight of boron nitride.

6. The boat of claim 5 wherein said elongated crucible portion is positioned atop said elongated heating portion and said crucible portion extends downward contiguous to the sides of said elongated heating portion.

7. The boat of claim 6 wherein said downward extension of said crucible portion is physically separated from said heating portion.

8. The boat of claim 6 wherein said downward extension of said crucible portion is separated from said heating portion by said heat conducting, substantially non-electrical conducting portion.

9. A boat according to claim 1, wherein said crucible portion is positioned above part of said heating portion, said heating portion extends upwardly of the sides of said crucible portion and is separated therefrom by said heat conducting, substantially non-electrical conducting portion.

* * * * *